US010228413B2

(12) United States Patent
Castelli et al.

(10) Patent No.: US 10,228,413 B2
(45) Date of Patent: Mar. 12, 2019

(54) DEVICE OPERATIONS MONITORING (71) Applicant: International Business Machines Corporation, Armonk, NY (US)

(72) Inventors: Vittorio Castelli, Westchester, NY (US); Martin Franz, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 15/454,332

(22) Filed: Mar. 9, 2017

(65) Prior Publication Data

US 2018/0259571 A1 Sep. 13, 2018

(51) Int. Cl.
*G01R 31/28* (2006.01)
*G01R 21/133* (2006.01)

(52) U.S. Cl.
CPC ....... *G01R 31/2825* (2013.01); *G01R 21/133* (2013.01)

(58) Field of Classification Search
CPC .............. G01R 31/2825; G01R 21/133; G06K 19/07758
USPC ...................... 702/57, 58; 361/93.1; 700/297
See application file for complete search history.

(56) References Cited

U.S. PATENT DOCUMENTS

| 8,000,074 B2 * | 8/2011 | Jones | ............... | G06K 19/07758 |
| | | | | 361/93.1 |
| 2009/0177414 A1 | 7/2009 | Cottrell | | |
| 2014/0371942 A1 * | 12/2014 | Matsuyama | .............. | H02J 3/14 |
| | | | | 700/297 |

FOREIGN PATENT DOCUMENTS

CN 201616022 10/2010

OTHER PUBLICATIONS

Rolls-Royce plc, "Engine Health Management," https://www.rolls-royce.com/about/our-technology/enabling-technologies/engine-health-management.aspx#sense, Apr. 16, 2016, downloaded Mar. 9, 2017.

* cited by examiner

*Primary Examiner* — John H Le
(74) *Attorney, Agent, or Firm* — Fleit Gibbons Gutman Bongini Bianco PL; Jeffrey N. Giunta (57) ABSTRACT A method and system to monitor electrical devices. At least one characteristic electric power consumption profile is determined for an operational cycle for an electrical device. The electrical device includes a number of components that each operate at respective time intervals within the operational cycle. A measured electric power consumption dataset is received, from an electrical power measurement apparatus connected to a power input of the electrical device, for the electrical device where the measured electric power consumption dataset includes measurements of electrical consumption by the electrical device over a time duration corresponding to at least part of the operational cycle. The measured electric power consumption dataset is compared to the at least one characteristic electrical power consumption profile associated with the electrical device. Based on the comparing, an operational condition from within a plurality of operating conditions of the electrical device is indicated.

17 Claims, 8 Drawing Sheets

DEVICE OPERATIONS MONITORING

BACKGROUND

The present invention generally relates to the field of monitoring electrical devices, and more particularly to monitoring electrical device operations for abnormalities.

Many electrical devices, such as refrigerators, dishwashers, and the like, include various electrical components that are subject to wear or other operating degradations. In some instances, a component of such a device that operates over time may fail suddenly. Upon failure of a component, that component or the entire device is often replaced to allow the functions of the device to continue to be performed.

SUMMARY

One embodiment of the present invention is a computer-implemented method. An exemplary computer-implemented method includes determining, by a computer, at least one characteristic specification of electric power consumption for an electrical device, which comprises a plurality of components. The exemplary computer-implemented method further includes receiving, by the computer, an operational measurement corresponding to the at least one characteristic specification for the electrical device over a time duration. The exemplary computer-implemented method also includes comparing, by the computer, the operational measurement to a corresponding characteristic specification for the electrical device. The exemplary computer-implemented method additionally includes identifying and indicating, by the computer, an operational condition for the electrical device, in response to the comparing.

Other embodiments of the invention include a system and a computer program product.

BRIEF DESCRIPTION OF THE DRAWINGS

In the accompanying figures, like reference numerals refer to identical or functionally similar elements throughout the separate views. The accompanying figures, which together with the detailed description form part of the specification, serve to further illustrate various embodiments in accordance with the present invention, in which.

DETAILED DESCRIPTION

Embodiments of the present invention monitor operations of electrical devices. In some embodiments, electric demand characteristics are determined and monitored during an operational cycle for an electrical device. In some embodiments, the monitoring includes a characterization of power demand profiles as a device operates over time. As will be seen from various embodiments described below, the profiling of the power demand for an electrical device over time may assist in a determination that presently measured power demand characteristics indicate a deviation to the extent that attention may be needed by the electrical device. For example, present power demand characteristics that deviate from a baseline may be a basis for initiating a service call for the electrical device.

By way of overview and without limitation, a dishwasher may have an operational cycle that begins by heating water with an electrically resistive heater, after which an electrically driven pump operates to pump water through the internal compartment of the dishwasher to wash the dishes, and then that same electrically driven pump operates, with a potentially different load characteristic, to drain the internal compartment of the dishwasher. After those phases of the operational cycle, another electrically resistive heater may operate to heat the internal compartment of the dishwasher e.g., to dry its contents. Drying the contents may also include operating an electrically driven fan to circulate air within the internal compartment, to vent air from the internal compartment, or both. These electrically driven pumps and fans typically have an electric motor that presents a partially resistive load and a partially reactive (inductive) load to the electrical supply of the dishwasher. In contrast, the electrically resistive heater elements, however, typically present a more predominantly resistive load to the electrical supply. Some embodiments monitoring both the resistive electrical current demand and the reactive electrical current demand. The reactive electrical current demand can include inductive and/or capacitive electrical current demand Some embodiments monitor and characterize the electric demand for each of these electrical current components in support of a particular identification of deviations of baseline electric demand for each of these components.

Figure 1:
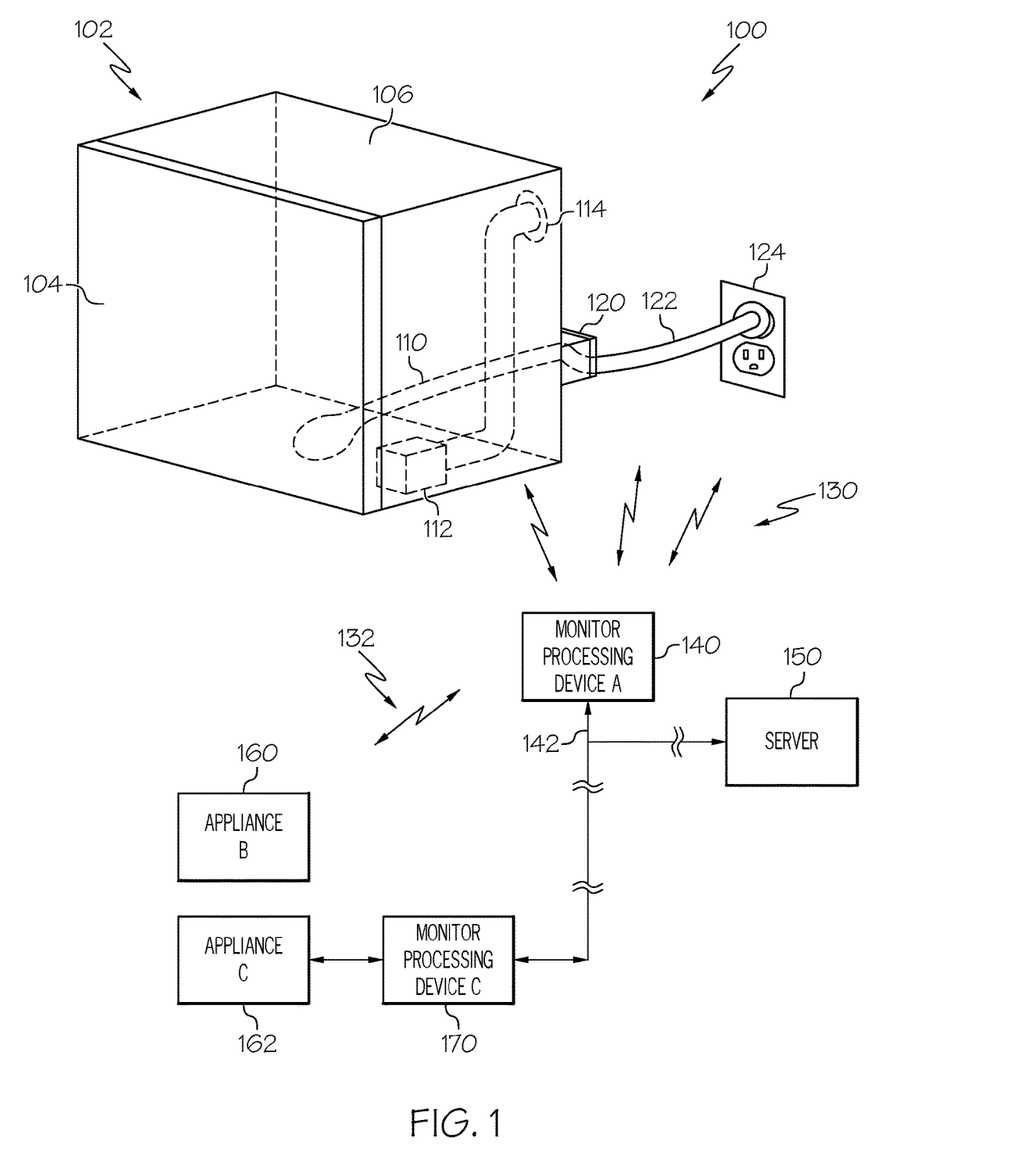
FIG. 1 illustrates an exemplary device monitoring environment, in accordance with the present invention.

FIG. 1 illustrates an exemplary device monitoring environment, in accordance with the present invention. It is to be understood that environment 100 depicted is an example only. In general, various appliance (sometimes referred to as a device) monitoring environments in accordance with the present invention can include any number of devices, device monitors and/or servers. Further, various devices may include more, less and/or different components than are illustrated. Further still, various dishwashers and/or any monitored electrical device, may have more, fewer and/or different operating cycles than are illustrated.

As depicted, exemplary environment 100 includes: a dishwasher 102, (as an example of a device whose operations are monitored); an appliance B 160; and an appliance C 162. Environment 100 also includes monitor processing devices 140, 170; and a server 150; examples of which are described in further detail below.

The example dishwasher 102 also includes several exemplary components: a water pump 112, a resistive heating element 110 and a fan 114. For purpose of this example only, dishwasher 102 will have a three-phase operational cycle. During a first phase, resistive heating element 110 is active for the purpose of pre-heating water in dishwasher 102. By way of further example only, a separate electrically resistive heater may be used to pre-heat the water. The water pump 112 operates to circulate water within the dishwasher during a second phase of the operating cycle of the dishwasher. The resistive heating element 110 may also operate during a third phase of the operating cycle, e.g., to heat the interior of dishwasher 102 in order assist in drying dishes and other objects within the dishwasher 102. The fan 114 may also operate during the third phase of the operating cycle, e.g., to ventilate the interior of the dishwasher 102 to further facilitate drying the dishes or such other objects. In some embodiments, dishwashers can have different elements e.g., heating elements and/or implementations thereof (not shown) during various operating cycle phases of the device. By way of further example only, dishwasher 102 can employ different heating elements during the first phase and the third phase of the operating cycle of the dishwasher.

Dishwasher 102 receives electrical power from a power outlet 124 via a power cord 122. The power cord 122 is connected to an electrical power connection 120 at dishwasher 102. In some embodiments, an electrical power measurement apparatus is implemented at one or more suitable locations such as within dishwasher 102, power outlet 124, power cord 122, or electrical power connection 120 of the dishwasher 102. An exemplary embodiment of a power measurement apparatus will be described with reference to FIG. 2. By way of preview, a few (non-limiting) examples include a voltage measuring device, an electrical current measuring device, or both.

The environment 100 includes a monitor processing device 140. As depicted, in some embodiments, monitor processing device A 140 is implemented physically separately from the device (e.g., dishwasher 102) being monitored, and can wirelessly receive electric power measurements transmitted by a compatible power measurement device (not depicted) that is also associated with the device being monitored. An example of a power measurement device will be described below. Device power consumption may be monitored continuously (or at discrete times) e.g., during active device operation and/or during one or more operating cycles thereof. In some embodiments, power consumption measurements are accumulated and transmitted by the power measurement device in the form of one or more electric power measurement dataset(s) (not depicted).

Figure 2:
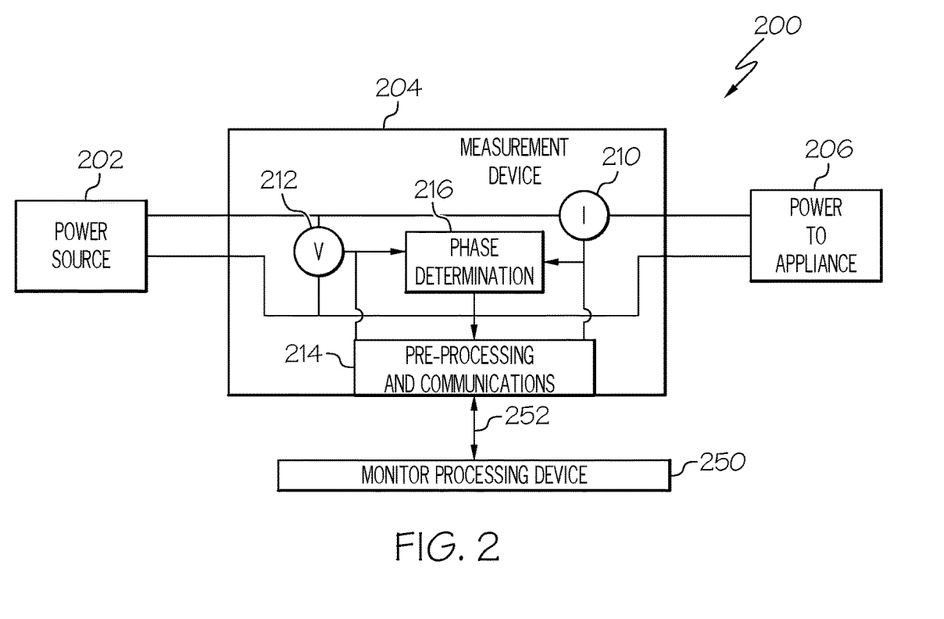
FIG. 2 illustrates an exemplary electrical power measurement apparatus, in accordance with the present invention.

In some embodiments, as depicted in FIG. 1, monitor processing device 140 may be configured to wirelessly receive (via wireless data links 130) electric power measurement dataset(s) transmitted from a compatible measurement device 204 (FIG. 2). Some embodiments of the present invention include features that facilitate a determination of abnormal device operation, in which case device repair may be recommended.

Referring again to the example depicted in FIG. 1, monitor processing device A 140 is operably connected to a network 142. Network 142 can any type of data communications network, including but not limited to a network or networks, such as the Internet. Monitor process device A 140 is adapted to communicate measured electrical power consumption datasets to server 150 via network 142. In some embodiments, monitor processing device A 140 can (alternatively, or additionally) receive via the network 142, an electric demand profile (not depicted) of a device to be monitored. By way of further example only, the profile may indicate: normal and/or abnormal power demand characteristics for dishwasher 102; power demand characteristics suggestive of an unexpected operation of one or more dishwasher 102 components; and/or a combination of these.

Referring again to the example depicted in FIG. 1, monitor processing device A 140 receives, via wireless data links 130, a number of received measured electric power measurement datasets applicable to dishwasher 102. In some embodiments, these datasets are be accumulated, stored, and/or processed as they are received (or in a batch mode), or any combinations of the foregoing.

In some embodiments, one or more components of monitor process device 140 and/or a power measurement device can be implemented within the device being monitored. By way of further example only, elements of the monitor processing device A 140 can be incorporated into or distributed among one or more of the dishwasher 102, the electrical power connection 120, the power cord 122, power outlet 124, another device, or any combination thereof.

In some embodiments, the monitor processing device A 140 includes a processor that performs an automated data characterization process on the received datasets. This exemplary automated data characterization process can determine electric demand characteristics for the dishwasher 102 based on observations during normal operations. In some embodiments, the automated data characterization process further characterizes changes in the electric demand characteristics of the dishwasher 102 over a period of time as the dishwasher 102 ages. In some embodiments, the automated data characterization process allows for normal changes in the electrical power consumption of the dishwasher 102 as the dishwasher 102 ages without characterizing those changes as abnormal or indicative of a maintenance problem. The automated data characterization process in some embodiments identifies received measured electric power consumption datasets that deviate from expected ranges and characterizes those data sets as indicating abnormal behavior. Such a characterization is able to be a basis for the monitor processing device 140 to indicate that the dishwasher 102 may need to be serviced.

In some embodiments, the automated data characterization processes apply various pre-processing algorithms to the received data sets, for example, received datasets that contain apparently anomalous data can be deemphasized or excluded by noise reduction processing performed on the received data sets. A purpose of the noise reduction processing in the context of this invention is to reduce the amount of unwanted data sample in the data processed. In an embodiment, electrical current values are excluded from further processing when they are determined, by noise reduction processing, to likely be erroneous or not useful to characterization processing. In various embodiments, noise reduction processing is able to include one or more of a variety of known techniques. In some examples, noise reduction processing is able to include time-frequency domain filtering approaches. Such time-frequency domain filter approaches in some embodiments de-emphasize ranges of the frequency spectrum that are known or suspected to contain noise in order to reduce the overall noise in the processed signal. In some embodiments, such time-frequency domain filtering approaches can be extended by dynamically de-emphasizing various ranges of the frequency spectrum based on previously observed characteristics of data produced by a particular device, related device, other relevant data, or combinations of these. In some embodiments, noise reduction in machine learning approaches use models based on known characteristics of similar data.

Automated data characterization processing in accordance with the present invention is well known. In some embodiments, the automated data characterization process includes algorithms that incorporate machine learning techniques. By way of illustration and not limitation, machine learning techniques in some embodiments include a group of techniques that allow a computer or other processor to process data not only according to an explicitly programmed algorithm, but also based on data relevant to a targeted problem. More specifically, in the case of event categorization as performed by some embodiments, a goal is to identify a category label, e.g., "normal functioning" versus "failure," that corresponds to a particular event reflected within the data measured on and reported by a monitored system or a part of such a monitored system.

By way of illustration and not limitation, one embodiment is able to incorporate a machine learning approach that has four aspects as are described below.

In an embodiment, a first aspect of machine leaning collects a substantial amount of data from similar systems or parts. These data are collected in an embodiment with labels indicating whether the data corresponds to or indicates a correct, or "ground truth" set of data. This data is sometimes referred to in the field of machine learning as "training" data. Training data for a given device or group of similar devices in an embodiment can be obtained during development and testing of the device, such as by the manufacturer or other entity. In further embodiments, training data is able to be collected from the devices installed at one or more the users' location. In various embodiments, training data collected from installed devices is able to be collected on a local bases, e.g., only from one customer premises, as part of a collaborative network of devices installed at multiple customer premises, via any other arrangement, or via any combinations of these.

In an embodiment, a second aspect of machine learning collects attributes of the data associated the category labels. These labels are sometimes referred to in the field of machine learning as "features" of the respective data that are associated with the different category labels.

In an embodiment, a third aspect of machine learning assigns numerical values to the above described features and/or their combinations. These numerical values are sometimes referred to in the field of machine learning as "weights." The above described features and/or their combination, along with the numerical values assigned to them, are sometimes referred to in the field of machine learning as a "model" based on the training data. In various embodiments, a large number of approaches are applicable in realizing this aspect, such as decision tree learning, support vector machines, other techniques as are known to practitioners of ordinary skill in the relevant arts, or any combination of these.

In an embodiment a fourth aspect of machine learning is the application of the model. In an embodiment, parameters from the monitored system are collected, and the previously created model is used to, based on the values of the parameters, assign a (previously unknown) label to the event for which the parameters were measured. The models used in this aspect may by updated as needed, based on models recreated at a central location, or using just the locally available data at the user's location.

In some embodiments, the monitor processing device A 140 receives definitions of profiles that define acceptable baseline electric demand profiles for the dishwasher 102, that define electric demand characteristics that correspond to abnormal operations for the dishwasher 102, that define profiles that may indicate an unexpected operation of various particular components within the dishwasher 102, or combinations of these. In some embodiments, data within received measured electric power consumption datasets are compared to or correlated with acceptable demand data specified within one or more of these profiles to determine whether the received power consumption indicates acceptable operations or a potential problem with the dishwasher 102.

In the example depicted, monitor processing device A 140 can exchange data with Appliance B 160 via a second wireless link 132. In general, monitor processing device A 140 is able to receive or exchange data with any one or more compatible electrical devices. In some embodiments, monitor processing device A 140 processes the measured electric power consumption datasets received from each monitored device (using one or more automated characterization algorithms) to separately characterize normal operations for each such device. In some embodiments, based on such separate characterizations of normal operations, the monitor processing device A 140 can identify potentially anomalous cooperating conditions for a monitored device and thus, a service call can be facilitated for that electronic device.

In some embodiments, the monitor processing device A 140 is operably connected to network 142 and can receive baseline electric demand profiles for the various electrical devices which it monitors e.g., for Appliance B 160. Some embodiments of a baseline electric demand profile for appliance B 160 describe characteristics corresponding to one or more abnormal operations for the Appliance B 160, and/or one or more unexpected operations of components within the device, or a combination of these. In some embodiments, monitor processing device A 140 compares recent electric power consumption measurements in datasets received from Appliance B 160 to the corresponding profiles to determine if the present operations of Appliance B 160 are normal, and possibly to identify components of Appliance B 160 that may be failing or otherwise indicate a need for service.

As depicted, monitor processing device C 170 is in communication with Appliance C 162. In some embodiments, monitor processing device C 170 is in wired communications with and operates with respect to Appliance C 162 in a manner similar to the above-described operation of monitor processing device A 140 with respect to dishwasher 102. For example, monitor processing device C 170 can receive a number of received measured electric power measurement datasets from Appliance C 162. These datasets can be communicated, accumulated, stored, processed as they are received, or combinations thereof, to support performance of an automated data characterization process on received datasets in accordance with the present invention. For example only, based on the electric power consumption of Appliance C 162, monitor processing device C 170 may determine: whether Appliance C 162 is operating normally or abnormally; whether a particular component of Appliance C 162 may be failing; one or more other conditions; or some combination thereof. Such determinations may be made based on an automated characterization process of the present invention, which can include a comparison of the electric power consumption measured to profiles of electric demand received from, for example, server 150.

FIG. 2 illustrates an exemplary electrical power measurement apparatus 200, in accordance with the present invention. In an embodiment, the electrical measurement power apparatus 200 monitors power consumed by a device, such as an appliance, and reports power measurements to a monitor processing device 250. In some embodiments, power measurements are embodied in the form of electric power consumption datasets that are provided to a monitor processing device 250. The monitor processing device 250 in an embodiment is similar to the above described monitor processing device A 140 described above. In general, the measurements represent recent (effectively present) amounts of resistive electrical current and reactive electrical current that are being consumed by an electrical device. Some embodiments of electrical power measurement device 204 are adapted for used with electrical devices, such as appliances, that receive power in the form of alternating current (AC) at a given voltage (V). As is understood by practitioners of ordinary skill in the relevant arts, resistive electrical current is electrical current that consumed by a device is electrical current that is in-phase with the voltage being provided to the electrical device. Reactive electrical current is electrical current that is ninety degrees (90°) out of phase with the voltage provided to the electrical device. Reactive electrical current is able to be referred to as inductive electrical current if the electrical current lags the voltage, and referred to as capacitive electrical current if the electrical current leads the voltage.

As depicted, the electrical power measurement apparatus 200 includes a measurement device 204 that receives power from a power source 202. Measurement device 204 provides power to a device via a power to appliance 206. In various embodiments, the power to appliance 206 can be in the form of: a power receptacle into which the device can plug into, a hardwired connection to the appliance, or some combinations of thereof. Power outlet 124 (FIG. 1) depicts one example of a receptacle-type power source.

Measurement device 204 includes an electrical current (I) meter 210, an electrical voltage (V) meter 212 (sometimes referred to as a voltmeter), a phase determination circuit 216, and a pre-processing and communications circuit 214. Voltage meter 212 measures the present electrical voltage available to power appliance 206. The current meter 210 measures the present electrical current being consumed by appliance 206. In an embodiment, these measured voltage and electrical current values are provided as a respective time sequence of values to the phase determination circuit 216 and to the pre-processing and communications circuit 214.

The phase determination circuit 216 in an example determines a phase angle between the measured voltage waveform produced by the voltage meter 212 and the measured electrical current waveform produced by the current meter 210. A variety of known techniques are readily adaptable to determine the phase angle between the voltage waveform and the electrical current. By way of illustration and not limitation, the phase determination circuit 216 is able to measure a time duration between zero crossings of the voltage waveform and the electrical current waveform. The phase angle between the voltage waveform and the electrical current waveform is able to be determined based on the ratio of that duration of time between the zeros crossings of the voltage waveform and electrical current waveform, and the period of the voltage waveform, or electrical current waveform. In an embodiment, the in-phase electrical current and the electrical current that is ninety degrees (90°) out of phase is able to be determined based on the phase angle between the voltage waveform and the electrical current waveform.

In an embodiment, the pre-processing and communications circuit 214 receives measured values of voltage, electrical current and the determined phase angle between the voltage and electrical current. In an embodiment, the electrical power measurement apparatus 200 reports RMS voltage and RMS electrical current values to external components, such as the monitor processing device 250. In an embodiment, Root-Mean-Square (RMS) values are determined by any suitable technique. Determination of RMS values is able to be performed in various embodiments by one or more of: the voltage meter 212 and the current meter 210; by the pre-processing and communications circuit 214; by another component (not shown); or by combinations of these. The in-phase, or resistive, electrical current in an embodiment is equal to the RMS electrical current value times the cosine of the phase angle between the voltage waveform and the electrical current waveform, and the reactive, or inductive, electrical current, which is the electrical current that is ninety degrees (90°) out of phase with voltage, is equal to the RMS electrical current value times the sine of the phase angle between the voltage waveform and the electrical current waveform.

In an embodiment, the pre-processing and communications circuit 214 is able to perform noise reduction on the datasets measured by the voltage meter 212, electrical current meter 210, and the phase determination circuit 216. Such noise reduction in an embodiment excludes measurements that are determined to be outliers or otherwise likely to be erroneous or not useful to downstream processing.

In various embodiments, the pre-processing and communications circuit 214 communicates the at least some of the measured voltage and electrical current data over a communications link 252 to a suitable recipient, such as monitor processing device 250 or the monitor processing device A 140 (FIG. 1).

It is to be understood that the electrical power measurement apparatus 200 is only one example implementation of a power measurement apparatus. As is understood by practitioners of ordinary skill in the art, the parts of or an entire electrical power measurement apparatus are able to be located in a wide range of locations along the electrical power supply connection to a particular electrical device, such as dishwasher 102. By way of example only, a measurement device 204 can be located at any suitable location along the power delivery system to the monitored device e.g., (with reference also now to FIG. 1) dishwasher 102. By way of further example only, in some embodiments, measurement device 204 can be located at a point of electrical power connection 120 to the monitored device. By way of yet further example only, measurement device 204 can be embodied within power cord 122, at a location anywhere along or connected to the power cord, such as within a power plug suitable for connection to power source 202. By way of yet another example only, measurement device 204 can be located within or connected to the power outlet 124 (FIG. 1). In some embodiments, different components of the measurement device 204 are distributed across different portions of the power supply chain, e.g., V 212 can be associated with (or located within) power outlet 124 (FIG. 1) and an I 210 can be located within power cord 122 (FIG. 1).

Figure 3:
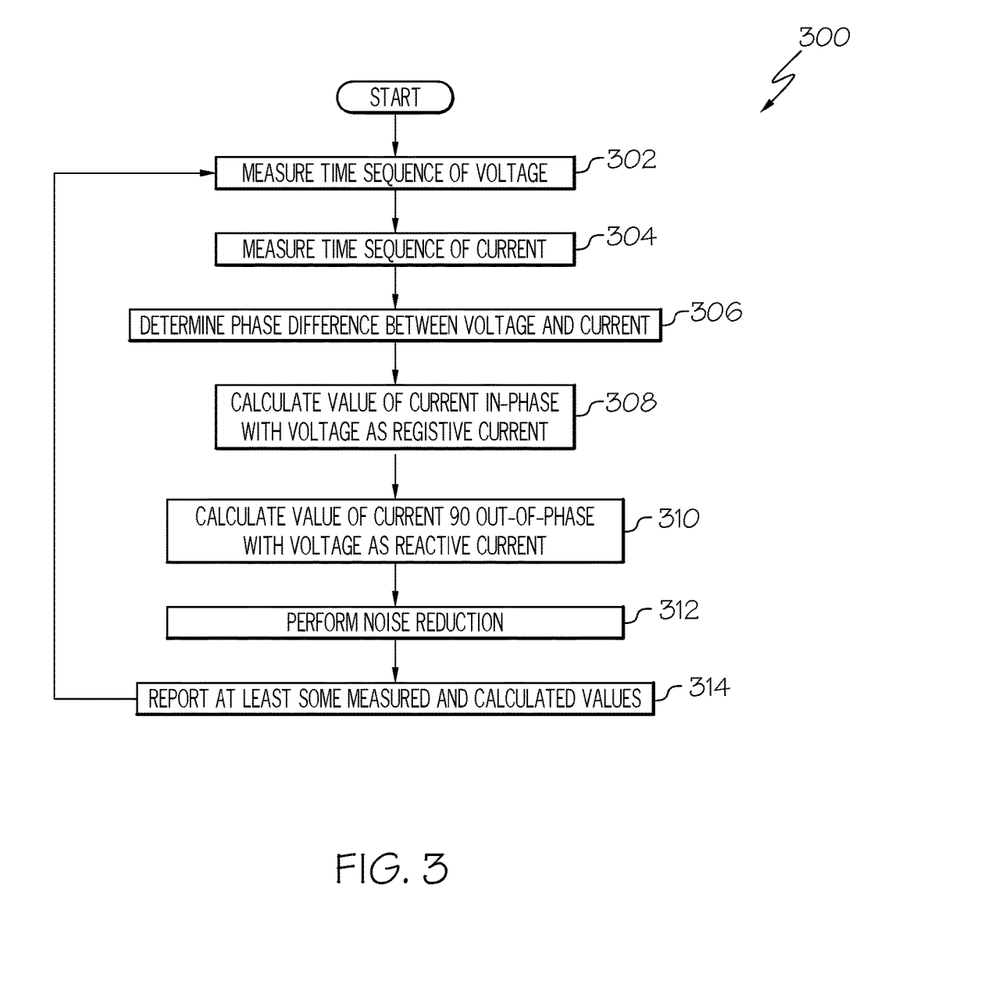
FIG. 3 illustrates an exemplary electrical current determination process, according to an example.

FIG. 3 illustrates an exemplary electrical current determination process 300, according to an example. The electrical current determination process 300 is presented by way of illustration and not limitation of an embodiment of a process performed by the electrical power measurement apparatus 200 described above.

The electrical current determination process 300 begins by measuring, at 302, a time sequence of voltage. In an embodiment, this time sequence of voltage is able to be measured by voltage meter 212 described above. A time sequence of electrical current is then measured, at 304. In an embodiment, the time sequence of electrical current is able to be measured by electrical current meter 210. A phase difference between the voltage waveform and electrical current waveform is then determined, at 306. This phase difference is determined in an example by the phase determination circuit 216, described above.

A value of electrical current that is in-phase with voltage is determined as in-phase, or resistive, electrical current at 308. A value of electrical current that is ninety degrees (90°) out of phase with voltage is determined, at 310. These values in an embodiment are determined by the pre-processing and communications circuit 214 according to the above described process.

In an embodiment, noise reduction is performed, at 312. In various embodiments, noise reduction is able to be performed on any one or more data such as on one or more of measured voltage values, measured electrical current values, calculated in-phase or resistive electrical current, calculated reactive or inductive electrical current, other values, or any combination of these. In alternative embodiments, noise reduction processing is not performed by processing within an electrical power measurement apparatus 200. In some such embodiments, noise reduction processing is performed by receives of data reported by the electrical power measurement apparatus 200, such as the monitor processing device 250.

At least some measured and/or calculated values are reported, at 314. In an embodiment, the pre-processing and communications circuit 214 reports these values as power measurements to various data receivers, such as the monitor processing device 250. The electrical current determination process 300 in an embodiment returns to measuring a time sequence of voltage, at 302, and continues with the following processing as is described above.

Figure 4:
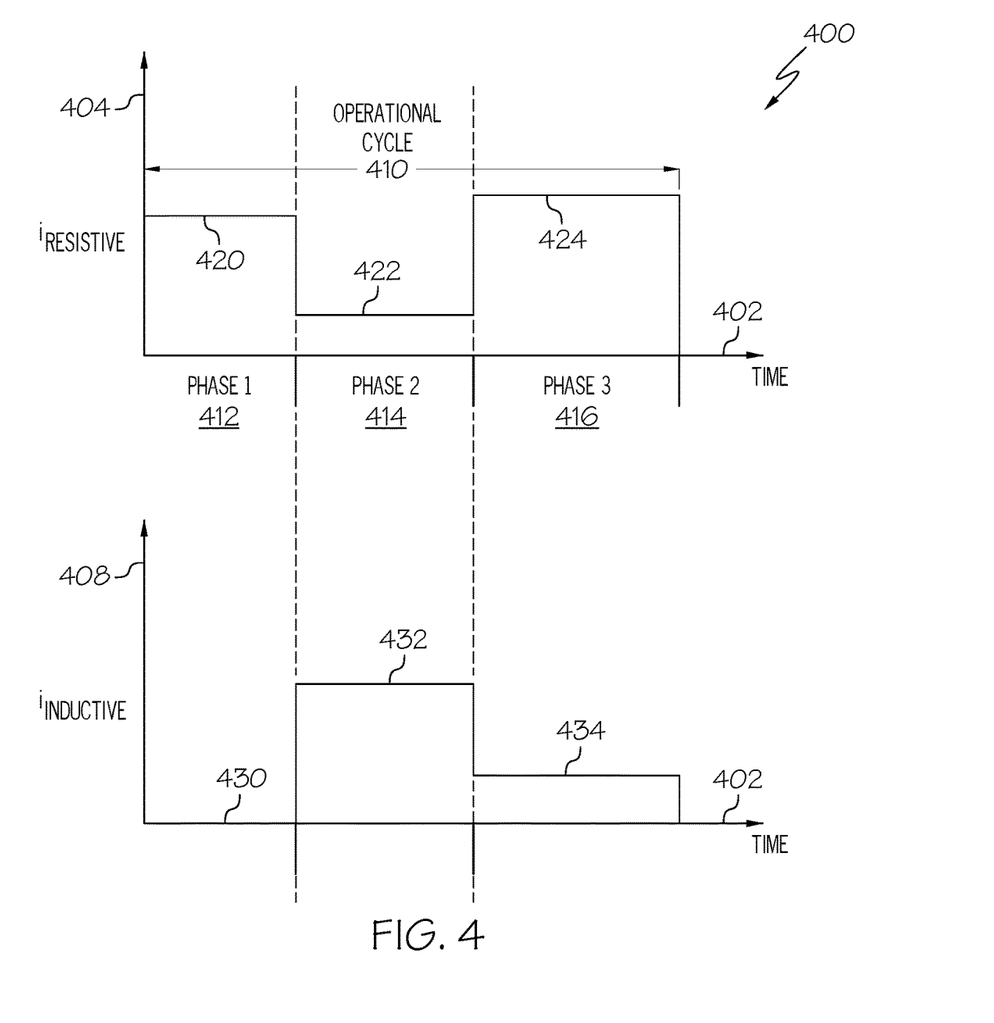
FIG. 4 illustrates an exemplary electrical power consumption dataset, in accordance with the present invention.

FIG. 4 illustrates an exemplary electrical current consumption dataset 400, in accordance with the present invention. The electrical power consumption dataset 400 includes a graphical representation of a resistive electrical current 404 consumption versus time 402 over an operations cycle 410 of an electrical device, and a graphical representation of an inductive electrical current 408 consumption versus time 402 over an operations cycle 410 of an electrical device. More specifically, the exemplary dataset 400 (collectively) graphically illustrates an example of an overall electrical current consumption that can be measured for an exemplary dishwasher 102 in an exemplary appliance monitoring environment 100 of FIG. 1. In various examples, the electrical current consumption dataset 400 illustrates either a characteristic specification of electric power consumption for an electrical device or an operational measurement for an electrical device over a time duration.

As depicted in FIG. 4, operational cycle 410, includes three different respective operational phases: a Phase 1 412, a Phase 2 414, and a Phase 3 416. Phase 1 412 depicts an example of electrical current consumption during a corresponding (first) pre-heating water phase by the resistive heating element 110 of dishwasher 102. Phase 2 414 depicts an example of electrical current consumption during a corresponding second phase that includes circulating water within the compartment of the dishwasher 102 using pump 112. Phase 3 416 depicts an example of electrical current consumption during a corresponding third phase that includes drying the contents of the dishwasher 102 using resistive heating element 110 along with fan 114 to circulate air.

The dishwasher 102, as is described above, includes different components that each operate during the different phases of the dishwasher's operational cycle 410. In this particular example, a resistive heating element 110, which draws primarily resistive electrical current, operates during Phase 1 412. During Phase 1 412, dataset 400 accordingly shows a relatively high value 420 of resistive electrical current 404 and a relatively low value 430 of inductive electrical current 408. These values reflect the predominantly resistive characteristic of the resistive heating element 110 operating during Phase 1.

During Phase 2 414, the pump 112—which includes an electric motor that generally draws both inductive electrical current and resistive electrical current—operates. As depicted, phase 2 422 exhibits a value of 422 of resistive electrical current 404 with a relatively higher value 432 of inductive electrical current. This reflects the expected (somewhat, but not totally, inductive) electric demand characteristic of the motor within the pump 412 that is operating during phase 2 422.

During phase 3 416, both the resistive heating element 110 and the fan 114 operate. The fan 114 includes a generally smaller motor that draws less total electrical current than pump 112. However, the combination of resistive electrical current drawn by resistive heating element 110 and the fan 114 results in a value 424 of resistive electrical current 404 as well as a value 434 of inductive electrical current that is greater than zero. After phase 3 416, the operational cycle 410 ends and no electrical current flows.

The electric power consumption dataset 400 depicts several sub-specifications of electrical power consumption. In particular, the resistive electrical current and inductive electrical current during each of Phase 1 412, Phase 2 414, and Phase 3 416 in this example are each sub-specifications of electric power consumption that are each associated with a different respective operational phase of the exemplary dishwasher 102.

Figure 5:
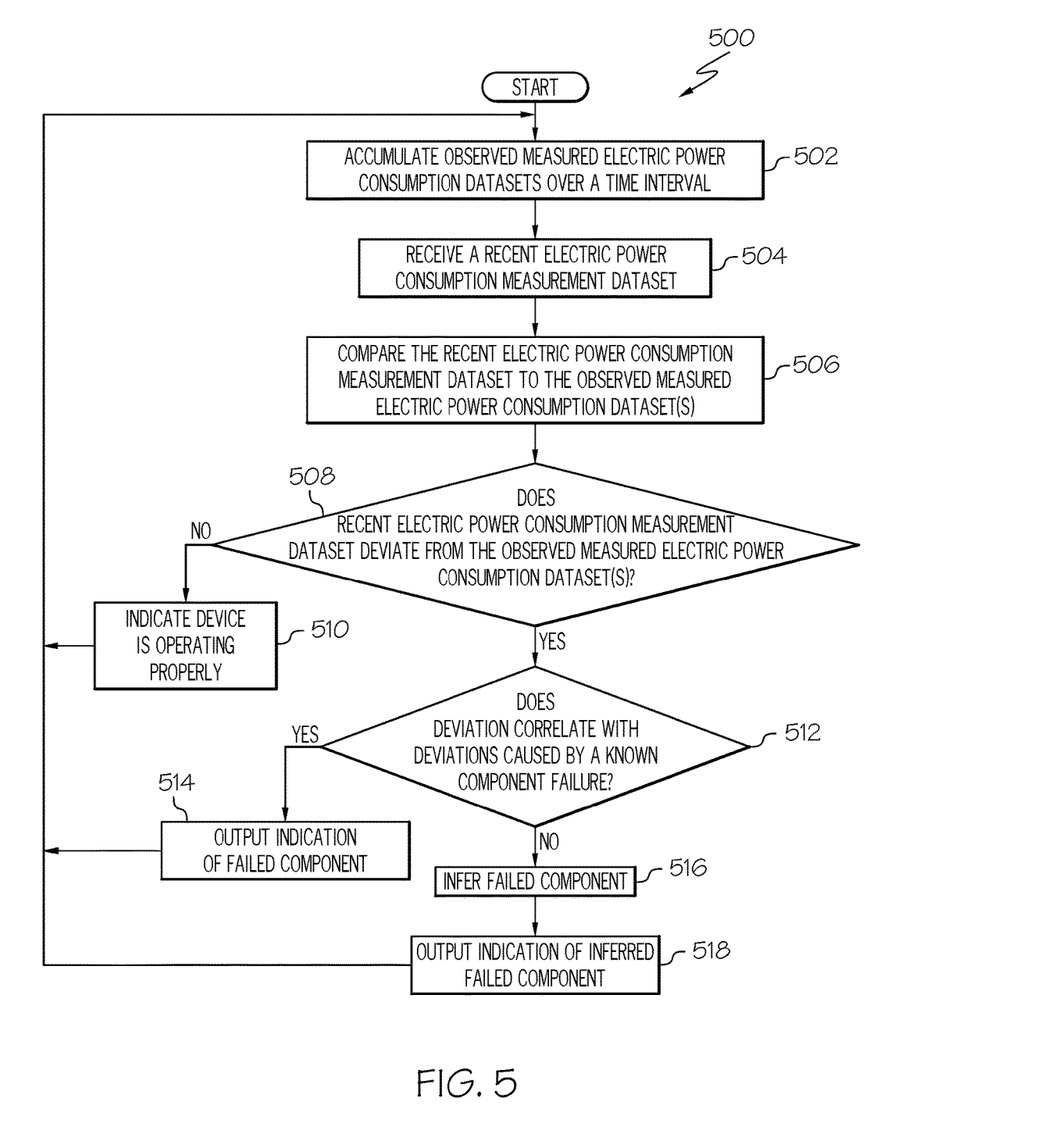
FIG. 5 illustrates an exemplary automated device operation characterization process, in accordance with the present invention.

FIG. 5 illustrates an exemplary characterization process, in accordance with the present invention. In some embodiments, the process is executed by a processor, such as is described with reference to the monitor processing device A 140 of FIG. 1. In some embodiments, the process characterizes the operating conditions of the electrical device based on one or more electric power consumption datasets for an electrical device that can facilitate such characterization as normal and/or anomalous operating conditions for the electrical device.

The process 500 begins, in step 502, by accumulating one or more electric power consumption datasets that reflect measurements of an electronic device obtained over some time interval. These datasets, by way of example only, can be accumulated over a time interval (e.g., a test period of the development cycle) that includes measurements made over multiple operational cycles of the electronic device. In some embodiments, the datasets are accumulated over a period of time as the electrical device, such as dishwasher 102 (FIG. 1), ages. In some embodiments, the measurements are made over period of time long enough to reflect a normal aging (normal wear and tear) of the device, e.g., such that the electrical power consumption of the device varies (as expected) due to its age. Using the above example of dishwasher 102, datasets observed over several operational cycles 410 of the dishwasher 102 may be accumulated to form a collection of observed measured electric power consumption datasets. Accumulating these datasets is one example of determining a characteristic electric power consumption profile for an operational cycle for the dishwasher 102, or of an electric device. The further processing/classification of such electric power consumption datasets, (an example of which is described below) can facilitate the creation of an acceptable baseline electric demand profile envelope.

The process depicted in FIG. 5 continues, at step 504, where one or more recent electric power consumption measurement dataset for the electronic device is received.

For purposes of this example only, we will assume that the measurement(s) reflect a present operational condition of the electronic device. In general, a recent measurement of electric power consumption dataset is not necessarily a most recent measurement and may be of any age. For purposes of this example only, recent electric power consumption measurement(s) includes is measurement(s) made after at least some of the observed measured electric power consumption datasets were accumulated in step 502.

In step 506, the recent electric power consumption measurement is compared to data in the observed measured electric power consumption datasets. In some embodiments, this comparison incorporates an automated data characterization process to characterize whether the recent electric power consumption measurement dataset deviates from, or alternatively is determined to be consistent with, patterns identified within the observed measured electric power consumption datasets by the automated data characterization processes.

In some embodiments, comparing the recent electric power consumption measurement dataset to the observed measured electric power consumption datasets utilizing an automated data characterization process includes evaluating a correlation value of the measured electric power consumption dataset with characterizations of the accumulated observed measured electric power consumption data sets. In some embodiments, the characterizations of the accumulated observed measured electric power consumption data sets are able to define an aging device electric demand envelope based on a present age of the electrical device.

In some embodiments, the automated data characterization process is able to identify patterns in changes of the electric power consumption of an electrical device as the electrical device ages. Accumulating these observed measured electric power consumption dataset over a time interval and processing these datasets with an automated data characterization process that identifies patterns in changes of the electrical power consumption of the electrical device as it ages is an example of determining an aging device demand envelope for the electrical device. In some embodiments, an aging device demand envelopes for the electrical device defines acceptable electric demand for the electrical device as a function of an age of the electrical device. In some embodiments, these automated data characterization processes are able to extrapolate acceptable electric demand for the electrical device in the future, and the device ages further. By allowing extrapolation of acceptable electric demand for the electrical device in the future, these automated data characterization process define acceptable electrical demand based on an age of the electrical device where that age is greater than an age of the electrical device during the accumulating of the plurality of observed measured electric power consumption data. The comparison of the recent electric power consumption measurement dataset to the observed measured electric power consumption datasets in some embodiments incorporates this identified pattern in electric power consumption. In some embodiments, the automated data characterization process incorporates the present age of the electrical device, and thus the expected change in electric power consumption, into this comparison.

A determination is made, at 508, as to whether the recent electric power consumption measurement dataset deviates from the observed measured electric power consumption datasets. In some embodiments, this determination is based upon a correlation value between the recent electric power consumption measurement dataset to the observed measured electric power consumption datasets having a value indication an acceptable correlation. In various embodiments, a threshold for an acceptable correlation is able to be determined based upon various design criteria, such as false positives. If this determination is false, an indication that the electrical device is operating properly is provided, at 510.

If this determination of deviations is true, a determination, at 512, is made of whether the deviation correlates with deviations caused by a known component failure. Deviations associated with known component failures are able to be obtained by any suitable technique. For example, programming within a processor performing the automated characterization processing flow 500 may associate a lack of resistive electrical current during phase 1 412 with a failure of the resistive heating element 110. In some embodiments, profiles of electrical power demands that are associated with different components in the electrical device being monitored are able to be received from a remote source, such as server 150.

If it is determined that the deviation correlates with deviations caused by a known component failure, an indication of the failed component is output, at 514. If no such correlation is determined, a component that is likely to have failed is inferred based on the above determined deviation. Such an inference is able to be based on various processing, such as programming that associates different electric demand characteristics with likely causes of failure. For example, a gradual increase in inductive electrical current during operation of pump 112 is likely to indicate a blockage in the passage carrying water that is being pumped. An output of the inferred failed component is output, at 518.

In some embodiments, the indication of the failed component, at 514, or the indication of the inferred failed component, at 518, are examples of indicating improper operation of the electrical device. In some embodiments, these determinations are also able to identify operational conditions that correspond to an upcoming failure of a particular component. In some embodiments, the indication of a failed component or the indication of an inferred failed component is able to be an indication that is a warning of an upcoming failure of the particular component. After indicting the device is operating normally, at 510, outputting an indication of a failed component, at 514, or outputting an indication of an inferred failed component at 518, the processing returns to accumulating, at 502, observed measured electric power consumption datasets over a time interval.

Figure 6:
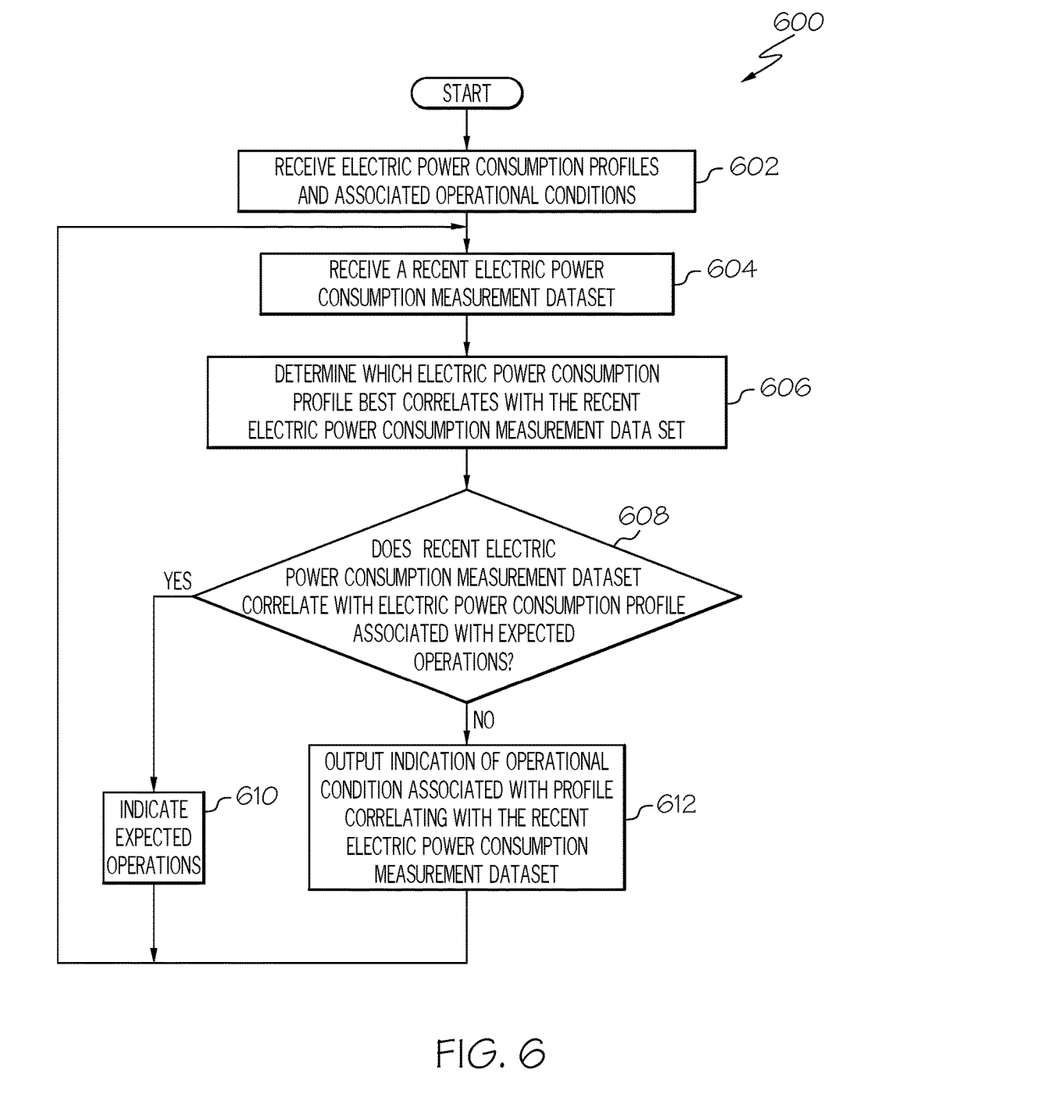
FIG. 6 illustrates a exemplary electric power consumption profile comparison process, in accordance with the present invention.

FIG. 6 illustrates an exemplary electric power consumption profile comparison process 600, in accordance with the present invention. The received electric power consumption profile comparison process 600 is an example of a process by which a processor, such as is included in the above described monitor processing device A 140, compares measured electric power consumption datasets received from an electrical device to electric power consumption profiles that correspond to normal various operational conditions for the electrical device. In various embodiments, the electric power consumption profiles are able to be associated with expected operating conditions for the electrical device, associated with anomalous operating conditions, associated with particular components within for the electrical device having failed or operating in a degraded condition, associated with other operating conditions, or combinations of these.

The received electric power consumption profile comparison process 600 begins by receiving, at 602, electric power consumption profiles for an electrical device and operational conditions that are associated with each received electric power consumption profile. In various embodiments, the received electric power consumption profiles are able to include acceptable baseline electric demand profiles that are determined by an automated analysis of observed measured electric power consumption datasets accumulated from a number of electrical devices and that are associated with normal operations of the electrical device, electric power consumption profiles associated with abnormal operations of the electrical device, or combinations of these.

The electric power consumption profiles associated with normal operations are able to include one or more lifespan acceptable baseline electric demand profiles. In some embodiments, the lifespan acceptable baseline electric demand profile is based upon an automated analysis of a number of observed measured electric power consumption datasets that were made for a number of electrical devices over a respective defined lifespan of those electrical devices. In some embodiments, the electrical devices are able to be different models or types of devices where each of the electrical devices has at least one component that is in the electrical device being monitored.

The electric power consumption profiles associated with abnormal operations are able to include one or more component failure profiles where each component failure profile is determined, based on an automated data classification process, to be associated with a failure of a particular component of the electrical device.

The received electric power consumption profile comparison process 600 continues by receiving, at 604, a recent electric power consumption measurement dataset for the electronic device. The recently measured power consumption dataset in some embodiments is a dataset that was measured sufficiently recently to reflect the present operational condition of the electronic device. In general, a recent electric power consumption measurement dataset is not necessarily a most recently measured dataset and may be of any age.

A determination of which electric power consumption profile correlates with the recent electric power consumption measurement dataset is made, at 606. A determination is made, at 608, as to whether the received recent electric power consumption measurement profile correlates with an electric power consumption profile that is associated with expected operations for the electrical device. If this determination is true, an indication of expected operations is provided, at 610. An indication of expected operations is an example of an indication of a proper operational condition for the electrical device. If a determined correlation is not associated with expected operations, the operational condition associated with the electric power consumption profile that correlates with the recent electric power consumption measurement dataset is output, at 612. In some embodiments, recently measured operational conditions associated with an electric power consumption profile are output at 612. For example, operational conditions might indicate an improper operational condition of the device, according to an applicable electric power consumption dataset. After outputting an indication, the received electric power consumption profile comparison process 600 returns to receiving recently electric power consumption measurements, at 604.

In some embodiments, such as when the received electric power consumption profiles includes a lifespan acceptable baseline electric demand profile, the present age of the electrical device is incorporated into the determination of which electric power consumption profile correlates with the recently measured electrical power consumption dataset. In some embodiments, this determination determines the correlation to a portion of the lifespan acceptable baseline electric demand profile that corresponds to the age of the electrical device.

Figure 7:
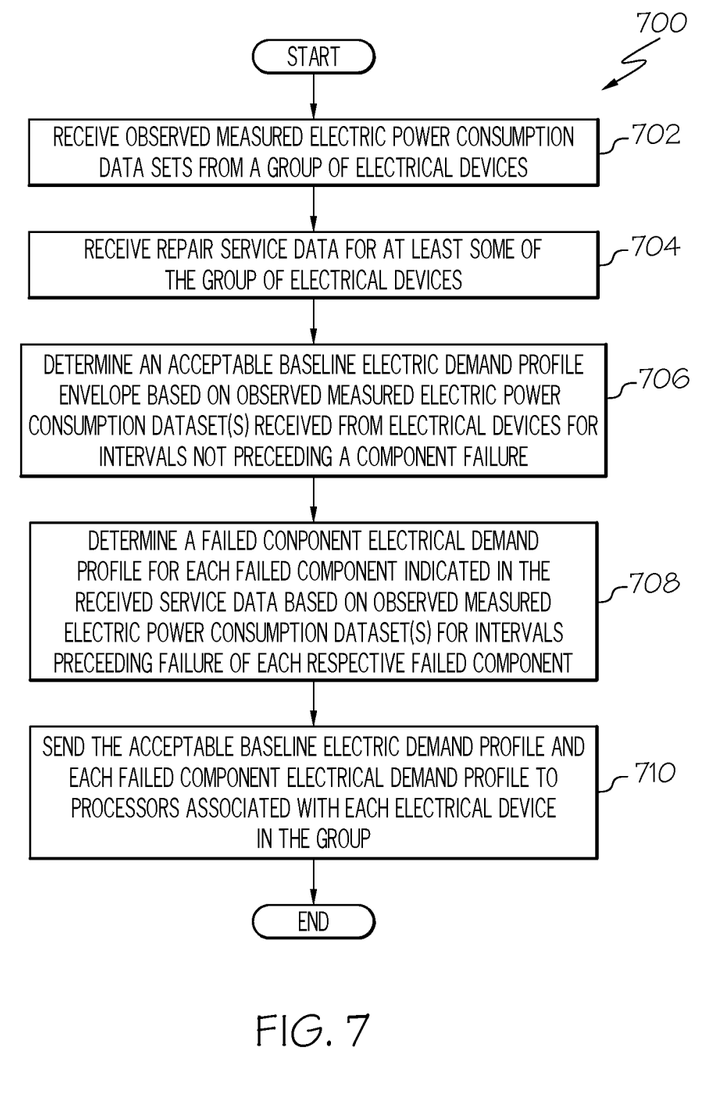
FIG. 7 illustrates an exemplary electric demand profile generation process, in accordance with the present invention.

FIG. 7 illustrates an electric demand profile generation process 700, according to some embodiments. In some embodiments, the electric demand profile generation process 700 is performed by the above described server 150 based upon electrical power consumption datasets received from various electrical devices.

The electric demand profile generation process 700 begins by receiving, at 702, measured electric power consumption datasets from a group of electrical devices. In some embodiments, the group of electrical devices includes various models or types of electrical devices that include the same or similar component part. In the present discussion, components that have sufficiently similar designs or characteristics such that their electrical consumption is sufficiently similar to base comparisons with observed electrical consumption measurements with one another are referred to as corresponding components.

Repair service data for at least some of the electrical devices in the group of electrical device is received, at 704. Repair service data is able to be received from any suitable source, such as from the manufacturer, authorized service technicians, end users, other sources, or combinations of these. The repair service data may include an identification of one or more electrical devices for which at least one component was repaired or replaced.

An acceptable baseline electric demand profile is determined, at 706, based on the received observed measured electric power consumption datasets that are received from devices for time intervals not preceding a component failure. Component failures may be determined by the received repair service data. In general, these received observed measured electric power consumption datasets contain measured electric power measurements that were made during normal operations of the electrical device. In some embodiments, an acceptable baseline electric demand profile is able to be made based upon an automated data characterization process that identifies normal electric power consumption by electric devices that don't deviate from normally observed characteristics.

A failed component electric demand profile for each failed component indicated in the received service data is determined, at 708, based on the received observed measured electric power consumption datasets that include electric power measurements that were made for intervals preceding failure of each respective failed component. Such a determination is able to be made based upon an automated data characterization process that identifies electric power consumption by electric devices that deviates from the above determined acceptable baseline electric demand profile in combination with identification of components that failed as reflected in the received service data.

The acceptable baseline electric demand profile and each failed component electric power demand profile are sent, at 710, to processors associated with each electrical device in the group. In various embodiments, these profiles are sent to monitor processing devices, such as the monitor processing device A 140 discussed above. These recipient devices, such as the monitor processing device A 140, are examples of remote devices to which acceptable baseline electric demand profile envelopes are sent. The electric demand profile generation process 700 then ends.

Figure 8:
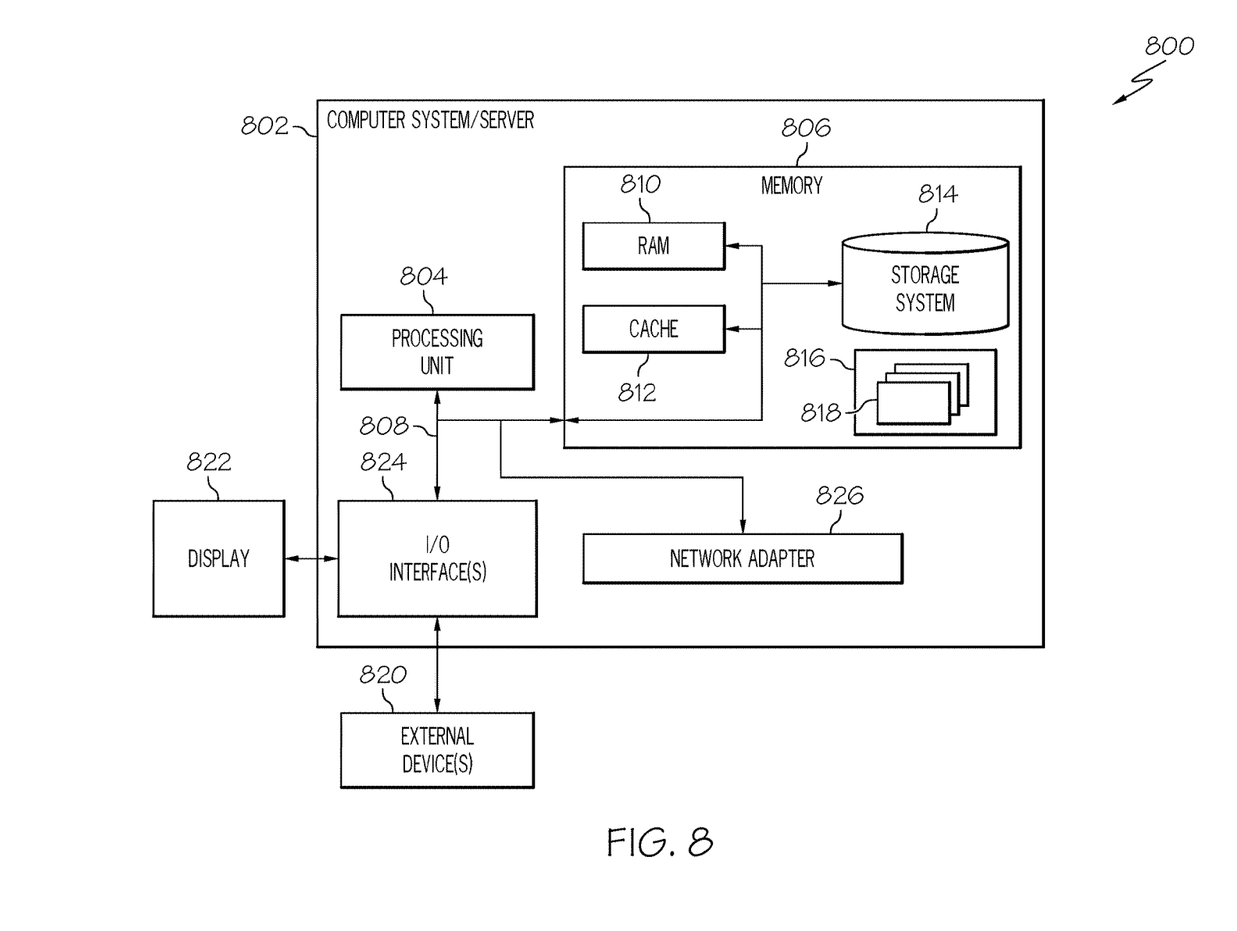
FIG. 8 is a block diagram illustrating an example of a system in accordance with the present invention.

FIG. 8 illustrates an exemplary system, in accordance with the present invention. By way of example only, server/system 802 represents a more detailed embodiment of server 150 (FIG. 1), although any suitably configured processing system configured to implement one or more embodiments of the present invention will suffice. In some embodiments, system 802 is a special purpose information processing system configured to perform one or more such embodiments.

As depicted, system 802 can include, but is not limited to, one or more processors or processing units ("processor") 804, memory 806, and a bus 808 that operably couples various system components, including memory 806 to processor 804.

The bus 808 represents one or more of several types of bus structures, including, without limitation, a memory bus or memory controller, a peripheral bus, an accelerated graphics port, and a processor or local bus using any of a variety of bus architectures. By way of example, and not limitation, such bus architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The memory 806 can also include various computer system readable media in the form of volatile memory (sometimes referred to as system memory), such as random access memory (RAM) 810 and/or cache memory 812. Memory 806 can also include other removable/non-removable, volatile/non-volatile storage media. By way of example only, storage system 814 can be provided for reading from and writing to a non-removable or removable, non-volatile media such as one or more solid state, optical and/or magnetic media (sometimes called a "hard drive"). In some embodiments, a magnetic disk drive for reading from and writing to a removable, non-volatile magnetic disk (e.g., a "floppy disk"), and/or an optical disk drive for reading from or writing to a removable, non-volatile optical disk such as a CD-ROM, DVD-ROM or other optical media, can be provided. In such instances, each can be connected to the bus 808 by one or more data media interfaces.

Memory can store program/utility 816, which can correspondingly store a set of program modules 818. In some embodiments, program modules 818 are implemented as computer instructions (software) configured to carry out one or more embodiments of the present invention e.g., one or more features of processes described with reference to FIGS. 5-7. Memory 806, by way of example only, and not limitation, may also include an operating system, one or more other (software) application programs, program modules, and program data (not depicted). Each of the operating system, one or more application programs, other program modules, and program data or some combination thereof, may include an implementation adapted to a networking environment. Program modules 818 generally carry out the functions and/or methodologies of the above described processes and systems.

The information processing system 802 can also communicate with one or more external devices 820 such as a keyboard, a pointing device, a display 822, and the like that can enable a user to interact with the system 802. System 802 may also include other components (e.g., network card, modem, etc.) that enable system/server 802 to communicate with one or more other external devices 820 such as other computing devices/systems (not depicted). Such communication can occur via I/O interfaces 824. Still yet, the system 802 can communicate with one or more networks such as a local area network (LAN), a general wide area network (WAN), and/or a public network (e.g., the Internet) via network adapter 826. As depicted, the network adapter 826 communicates with the other components of system 802 via bus 808. Other hardware and/or software components can also be used in conjunction with the information processing system 802. Examples include, but are not limited to: microcode, device drivers, redundant processing units, external disk drive arrays, RAID systems, tape drives, and data archival storage systems.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A computer-implemented method, comprising:

accumulating one or more electric power consumption datasets containing data corresponding to a period of time during which an electrical device ages, where the electrical device comprises a plurality of components;

determining, by a computer, at least one characteristic specification of electric power consumption for the electrical device, which comprises a plurality of components;

determining an aging device electric demand envelope for the electrical device, the aging device electrical demand envelope comprising characteristic specifications of electrical power consumption for the electrical device wherein the at least one characteristic specifications of electrical power consumption are based on an age of the electrical device;

receiving, by the computer, an operational measurement corresponding to a corresponding characteristic specification within the at least one characteristic specification for the electrical device over a time duration;

comparing, by the computer, the operational measurement to the corresponding characteristic specification for the electrical device, said comparing comprising correlating electric power consumption dataset data with acceptable electric demand data from the aging device electric demand envelope, based on a present age of the electrical device; and identifying and indicating, by the computer, an operational condition for the electrical device, in response to said comparing, wherein the operational condition is based on a correlation value of the electric power consumption dataset data and the acceptable electric demand data from the aging device electric demand envelope.

2. The computer-implemented method of claim 1, wherein the at least one characteristic specification for the electrical device comprises a plurality of sub-specifications of electric power consumption, each sub-specification being associated with a different respective operational phase for the electrical device and specifying an electrical power consumption for its associated respective operational phase.

3. The computer-implemented method of claim 1, wherein the at least one characteristic specification for the electrical device is determined from a baseline electric demand profile envelope for the electrical device, the method further comprising: determining whether the operational measurement is within the baseline electric demand profile envelope.

4. The computer-implemented method of claim 3, further comprising:
said identifying and indicating an operational condition for the electrical device further comprises indicating one of a proper operational condition for the electrical device and an improper operational condition for the electrical device, in response to said determining whether the operational measurement is within the baseline electric demand profile envelope.

5. The computer-implemented method of claim 1, wherein said determining at least one characteristic specification further comprises:
receiving, by the computer, a characteristic electric power consumption profile for the electric device, wherein the characteristic electric power consumption profile includes one or more electric power consumption datasets based on power measurements collected from a plurality of electrical devices that contain at least one component of the plurality of components; and
analyzing, by the computer, the characteristic electric power consumption profile for the electric device, and
wherein said comparing comprises determining that the operational measurement one correlate with the characteristic electric power consumption profile.

6. The computer-implemented method of claim 5, further comprising:
receiving, by the computer, a baseline electric demand profile for a defined lifespan of the electrical device, wherein the baseline electric demand profile is based on one or more electric power consumption datasets accumulated from a plurality of electrical devices over the defined lifespan of the electrical device,
wherein said comparing further comprises comparing the operational measurement for a present age of the electrical device to data representing a portion of the defined lifespan corresponding to the present age of the electrical device.

7. The computer-implemented method of claim, wherein the correlation indicates an improper operation of the electrical device.

8. The computer-implemented method of claim 1, wherein the determining at least one characteristic specification of electric power consumption comprises:
receiving a failed first component electric demand profile, the failed first component electric demand profile being based on a set of observed measured electric power consumption datasets associated with a failure of a first component of the electrical device,
where the comparing comprises determining that the operational condition indicates an upcoming failure of the first component.

9. The computer-implemented method of claim 8, where the failed first component electric demand profile is based upon a collection of observed measured electric power consumption datasets that are associated with a failure of the first component.

10. A computer program product for monitoring operations of a device, said computer program product comprising:
a computer readable storage medium having stored thereon:
first program instructions executable by a processor to cause a device to accumulate one or more electric power consumption datasets containing data corresponding to a period of time during which an electrical device ages, where the electrical device comprises a plurality of components;
second program instructions executable by a processor to cause a device to determine at least one characteristic specification of electric power consumption for the electrical device, which comprises a plurality of components;
third program instructions executable by a processor to cause a device to determine an aging device electric demand envelope for the electrical device, the aging device electrical demand envelope comprising characteristic specifications of electrical power consumption for the electrical device wherein the at least one characteristic specifications of electrical power consumption are based on an age of the electrical device;
fourth program instructions executable by the processor to cause the device to receive an operational measurement corresponding to a corresponding characteristic specification within the at least one characteristic specification for the electrical device over a time duration;
fifth program instructions executable by the processor to cause the device to compare the operational measurement to a corresponding characteristic specification for the electrical device by at least correlating electric power consumption dataset data with acceptable electric demand data from the aging device electric demand envelope, based on a present age of the electrical device; and
sixth program instructions executable by the processor to cause the device to identify and indicate an operational condition for the electrical device, in response to a comparison of the operational measurement to the corresponding characteristic specification, wherein the operational condition is based on a correlation value of the electric power consumption dataset data and the acceptable electric demand data from the aging device electric demand envelope.

11. The computer program product of claim 10, wherein the first program instructions cause the device to determine the at least one characteristic specification for the electrical device from a baseline electric demand profile envelope for the electrical device, the computer readable storage medium further having stored thereon fifth program instructions executable by the processor to cause the device to determine whether the operational measurement is within the baseline electric demand profile envelope.

12. The computer program product of claim 10, wherein the first program instructions executable by the processor to cause the device to determine at least one characteristic specification further comprise:
fifth program instructions executable by the processor to cause the device to receive a characteristic electric power consumption profile for the electric device, wherein the profile includes one or more electric power consumption datasets based on power measurements collected from a plurality of electrical devices that contain at least one component of the plurality of components; and sixth program instructions executable by the processor to cause the device to analyze the profile for the electric device; and wherein said third program instructions executable by the processor to cause the device to compare comprises seventh program instructions executable by the processor to cause the device to determine that the operational measurement one correlate with the profile.

13. A system for monitoring operations of a device, comprising:

a processor;

a memory, operably coupled to the processor, the memory storing processor-readable program instructions that when executed by the processor, cause the system to:

accumulate one or more electric power consumption datasets containing data corresponding to a period of time during which an electrical device ages, where the electrical device comprises a plurality of components;

determine at least one characteristic specification of electric power consumption for the electrical device, which comprises a plurality of components;

determine an aging device electric demand envelope for the electrical device, the aging device electrical demand envelope comprising characteristic specifications of electrical power consumption for the electrical device wherein the at least one characteristic specifications of electrical power consumption are based on an age of the electrical device;

receive, from an electrical power measurement apparatus connected to a power input of an electrical device, an operational measurement corresponding to the at least one characteristic specification for the electrical device over a time duration;

compare the operational measurement to a corresponding characteristic specification for the electrical device by at least correlating electric power consumption dataset data with acceptable electric demand data from the aging device electric demand envelope, based on a present age of the electrical device; and identify and indicate an operational condition for the electrical device, in response to a comparison of the operational measurement to the corresponding characteristic specification, wherein the operational condition is based on a correlation value of the electric power consumption dataset data and the acceptable electric demand data from the aging device electric demand envelope.

14. The system of claim 13, wherein the at least one characteristic specification for the electrical device is determined from a baseline electric demand profile envelope for the electrical device, said processor-readable program instructions that, when executed by the processor, further cause the system to determine whether the operational measurement is within the baseline electric demand profile envelope.

15. The system of claim 14, wherein said processor-readable program instructions that when executed by the processor, cause the system to identify and indicate an operational condition for the electrical device further comprise processor-readable program instructions that when executed by the processor, further cause the system to indicate one of a proper operational condition for the electrical device and an improper operational condition for the electrical device, in response to a determination that the operational measurement is within the baseline electric demand profile envelope.

16. The system of claim 13, wherein said processor-readable program instructions that when executed by the processor, cause the system to determine at least one characteristic specification further comprise processor-readable program instructions that when executed by the processor, cause the system to:

receive a characteristic electric power consumption profile for the electric device, wherein the profile includes one or more electric power consumption datasets based on power measurements collected from a plurality of electrical devices that contain at least one component of the plurality of components; and analyze the profile for the electric device; and wherein said processor-readable program instructions that when executed by the processor, cause the system to compare further comprise processor-readable program instructions that when executed by the processor, cause the system to determine that the operational measurement one correlate with the profile.

17. The system of claim 13, wherein said processor-readable program instructions further comprise processor-readable program instructions that when executed by the processor, further cause the system to:

receive baseline electric demand profile for a defined lifespan of the electrical device, wherein the profile is based on one or more electric power consumption datasets accumulated from a plurality of electrical devices over the defined lifespan of the electrical device, wherein said processor-readable program instructions that when executed by the processor, cause the system to compare further comprise processor-readable program instructions that when executed by the processor, cause the system to compare the operational measurement for a present age of the electrical device to data representing a portion of the defined lifespan corresponding to the present age of the electrical device.

* * * * *